United States Patent [19]
Palmer

[11] Patent Number: 6,008,988
[45] Date of Patent: *Dec. 28, 1999

[54] INTEGRATED CIRCUIT PACKAGE WITH A HEAT SPREADER COUPLED TO A PAIR OF ELECTRICAL DEVICES

[75] Inventor: Mark J. Palmer, Phoenix, Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/805,452

[22] Filed: Feb. 25, 1997

Related U.S. Application Data

[63] Continuation of application No. 08/575,914, Dec. 20, 1995, abandoned.

[51] Int. Cl.[6] ................................................... H05K 7/20
[52] U.S. Cl. .................. 361/704; 174/16.3; 257/713; 361/715; 361/749
[58] Field of Search .......................... 174/16.3; 257/678, 257/690, 699, 706–707, 712–713; 361/704, 707, 714–718, 722, 728, 730

[56] References Cited

U.S. PATENT DOCUMENTS

| | | | |
|---|---|---|---|
| 4,612,601 | 9/1986 | Watari | 361/718 |
| 5,297,006 | 3/1994 | Mizukoshi | 361/707 |
| 5,311,402 | 5/1994 | Kobayashi et al. | 361/707 |
| 5,396,403 | 3/1995 | Patel | 361/705 |
| 5,398,160 | 3/1995 | Umeda | 361/707 |
| 5,455,382 | 10/1995 | Kojima et al. | 361/709 |
| 5,625,227 | 4/1997 | Estes et al. | 361/699 |

*Primary Examiner*—Gregory Thompson
*Attorney, Agent, or Firm*—Blakely, Sokoloff, Taylor & Zafman LLP

[57] ABSTRACT

A multi-chip module which contains a heat spreader that maintains a relatively uniform temperature profile between the devices of the module. The module includes a first electronic device and a second electronic device that are both mounted to a package. The devices are electrically connected by routing within the package. A heat spreader that is thermally coupled to both devices. The heat spreader transfers the heat generated by the electronic devices so that the devices operate at approximately the same temperature. A heat slug may be attached to the heat spreader to reduce the thermal impedance of the module.

3 Claims, 1 Drawing Sheet

INTEGRATED CIRCUIT PACKAGE WITH A HEAT SPREADER COUPLED TO A PAIR OF ELECTRICAL DEVICES

This is a Continuation Application of application Ser. No. 08/575,914, filed Dec. 20, 1995, abandoned.

BACKGROUND OF THE INVENTION

1. Field of the Invention

The present invention relates to an integrated circuit package.

2. Description of Related Art

Integrated circuits are typically housed within a plastic or ceramic package. The package has external contacts that are soldered to a printed circuit board. The printed circuit board may have a number of packages soldered to the surface of the board. Conventional packages typically contain a single electronic device, such that the device must communicate with another device through the package and printed circuit board. For high speed electronic devices, the noise created by the board and packages has been found to degrade the performance of the devices. For this reason there has been developed packages that contain multiple integrated circuits.

It is desirable to interconnect the devices of a multi-chip module (MCM) so that the circuits can communicate without going through the package and external circuit board. For optimum efficiency it is desirable if both devices communicate at the same operating speed. The operating speed of an integrated circuit is a function of the junction temperature. The operating speed of two integrated circuits within a MCM may be different because one device may generate more heat than the other device. For example, a microprocessor may generate more heat than a second level cache located within the same package as the processor. The varying heat rates may create a variance of operating speeds. It would be desirable to provide a multi-chip module that produces a relatively uniform temperature profile for the integrated circuits within the package.

SUMMARY OF THE INVENTION

The present invention is a multi-chip module which contains a heat spreader that maintains a relatively uniform temperature profile between the devices of the module. The module includes a first electronic device and a second electronic device that are both mounted to a package. The devices are electrically interconnected by routing located within the package. The module has a heat spreader that is thermally coupled to both electronic devices. The heat spreader transfers the heat generated by the electronic devices so that the devices operate at approximately the same temperature. A heat slug may be attached to the heat spreader to reduce the thermal impedance of the module. Maintaining a common temperature allows the devices to perform at the same operating speed.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
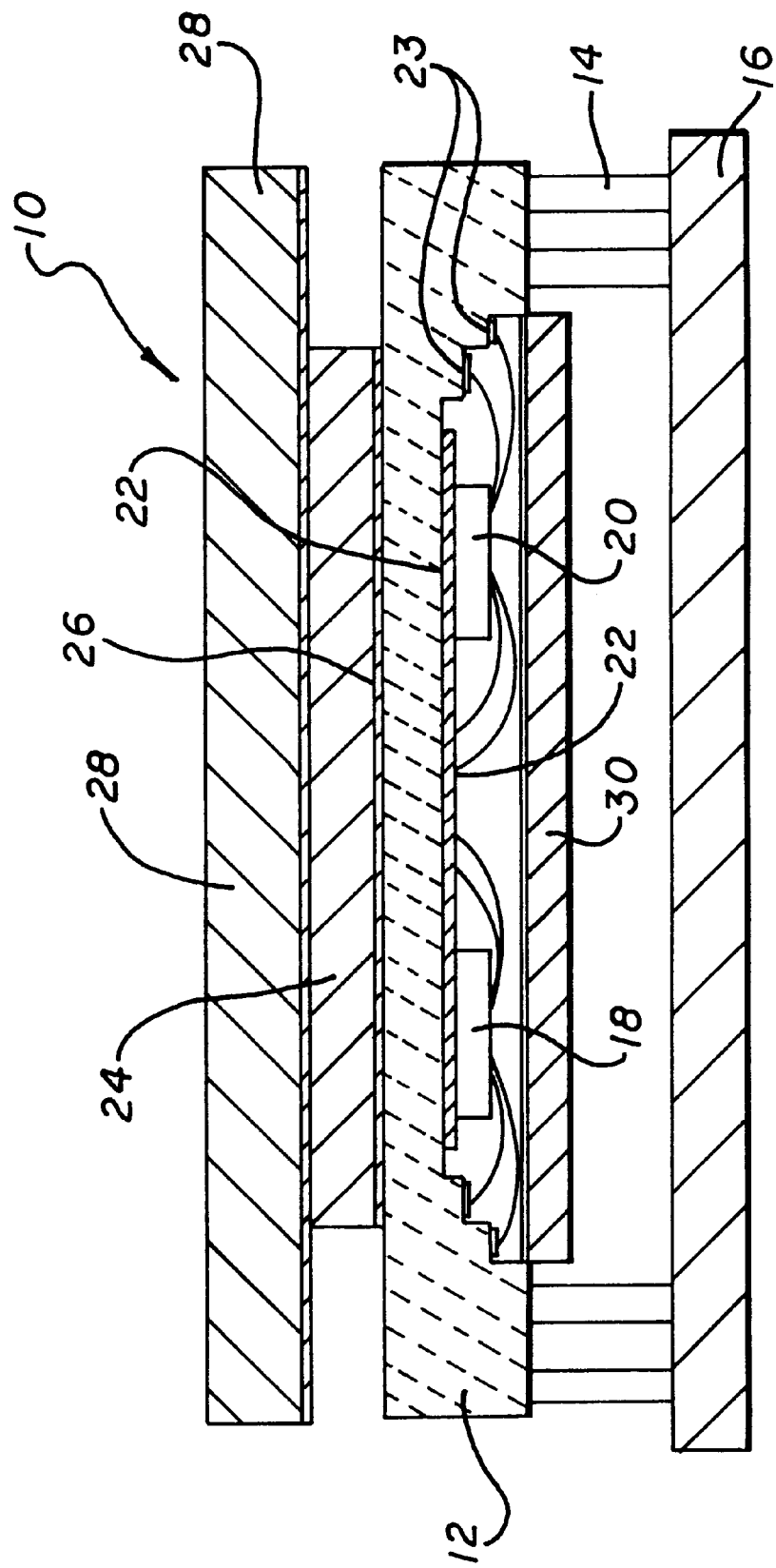
FIG. 1 is a cross-sectional view of a multi-chip module of the present invention.

Referring to the drawings more particularly by reference numbers, FIG. 1 shows a multi-chip module 10 of the present invention. The module 10 includes a package 12. Extending from the package 12 are a plurality of pins 14 that are soldered to an external printed circuit board 16. The printed circuit board 16 may have other integrated circuit packages (not shown) also mounted to the board 16 which communicate with the devices within the module 10. The package 12 may be constructed from molded plastic, co-fired ceramic or any other suitable electronic packaging material. The package 12 contains internal routing (not shown) to provide power and signals to the devices within the module 10. Although a plurality of pins 14 are shown and described, it is to be understood that the module 10 may have a plurality of solder pads (not shown) that are soldered to the printed circuit board 16.

Mounted to the package 12 is a first electronic device 18 and a second electronic device 20. The electronic devices may be any passive or active electrical device. By way of example, the first device 18 may be a microprocessor and the second device 20 may be a second level cache memory chip. The devices 18 and 20 are preferably electrically interconnected within the module 10. The electronic devices 18 and 20 may be connected by a tape automated bonding (TAB) tape 22 that is attached to corresponding bonding pads 23 of the devices and the package 12. The bonding pads 23 may be connected to the pins 14 by internal routing of the package 12. The TAB tape 22 preferably has routing that allows the first electronic device 18 to access the second electronic device 20 without having to route signals through the package 12 and external circuit board 16, thereby improving the speed and performance of the system. Although only two electronic devices are shown and described, it is to be understood that the module 10 may have more than two devices.

The electronic devices 18 and 20 both generate heat. One device may generate more heat than the other device so that the operating temperatures of the devices are different. For example, the first electronic device 18 may generate more heat, and thus operate at a higher temperature, than the second electronic device 20. The variance in temperatures may affect the operating speeds of the devices.

A heat spreader 24 is coupled to both electronic devices 18 and 20 to more evenly spread the heat and create a relatively uniform temperature profile for the two devices. The heat spreader 24 allows heat to flow from one device to the other device, so that both devices operate at approximately the same temperature. The heat spreader 24 provides a heat sink which has a base temperature that is common for both devices. The heat spreader 24 is preferably constructed from copper, aluminum or some other thermally conductive material. The package may contain a plurality of thermal vias that provide a direct thermal path from the devices to the heat spreader 24.

The heat spreader 24 may be mounted to the package with a thermal epoxy. Alternatively, the heat spreader 24 may be coupled to the package by a thermal grease 26. The package and heat spreader 24 undergo a thermal expansion when the temperature of the components increases. The metallic heat spreader 24 typically has a higher thermal coefficient of expansion than the package which is constructed from semiconductive material. The thermal grease 26 allows the heat spreader 24 to expand relative to the package without inducing strain between the components. To reduce the thermal expansion mismatch between the heat spreader 24 and the package, nickel or molybdenum may be added to the copper or aluminum to reduce the thermal coefficient of expansion of the heat spreader 24.

To reduce the thermal resistance of the module 10, a heat slug 28 may be attached to the heat spreader 24. The heat slug 28 is preferably constructed from a thermally conductive material such as copper or aluminum. The heat slug 28 may be attached to the heat spreader 24 by thermal epoxy or grease. The top surface of the heat slug 28 is typically exposed to the ambient and provides a heat transfer surface between the module 10 and the surrounding air. The heat spreader 24 and slug 28 may be embedded in a plastic package or bonded to a ceramic package. The package may have a lid 30 to enclose the devices 18.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A multi-chip module, comprising:
   a package that has a base portion and a plurality of bond pads;
   a tape automated bonding tape attached to said base portion;
   a first electronic device mounted and electrically connected to said tape automated bonding tape;
   a second electronic device that is mounted and electrically connected to said tape automated bonding tape;
   a plurality of bond wires that attach said first and second electronic devices to said bond pads;
   a lid that is attached to said package so that said first and second electronic devices are enclosed by said lid and said base portion of said package; and,
   a heat spreader that is mounted to said base portion of said package.

2. The module as recited in claim 1, wherein said first electronic device is a microprocessor and said second electronic device is a cache memory.

3. A module as recited in claim 1, further comprising a heat slug that is mounted to said heat spreader.

* * * * *